(12) United States Patent
Lee et al.

(10) Patent No.: US 10,987,791 B2
(45) Date of Patent: Apr. 27, 2021

(54) PROBE ASSEMBLY OF A METAL CONNECTOR NAILER

(71) Applicant: Testo Industry Corp., Taichung (TW)

(72) Inventors: Hsing-Hua Lee, Taichung (TW); Ju Shuang Lin, Taichung (TW)

(73) Assignee: Testo Industry Corp., Taichung (TW)

( * ) Notice: Subject to any disclaimer, the term of this patent is extended or adjusted under 35 U.S.C. 154(b) by 289 days.

(21) Appl. No.: 16/372,048

(22) Filed: Apr. 1, 2019

(65) Prior Publication Data

US 2020/0306943 A1     Oct. 1, 2020

(51) Int. Cl.
    *B25C 7/00*            (2006.01)
    *G01R 1/067*       (2006.01)
    *B25C 1/00*            (2006.01)

(52) U.S. Cl.
    CPC ............... *B25C 7/00* (2013.01); *B25C 1/008* (2013.01); *G01R 1/06788* (2013.01)

(58) Field of Classification Search
    CPC .................................. B25C 7/00; B25C 1/008
    USPC .......................................................... 227/110
    See application file for complete search history.

(56) References Cited

U.S. PATENT DOCUMENTS

| | | | | |
|---|---|---|---|---|
| 5,452,835 A * | 9/1995 | Shkolnikov | ............... | B25C 7/00 227/8 |
| 6,789,718 B2 * | 9/2004 | Canlas | ...................... | B25C 7/00 227/130 |
| 6,808,101 B2 * | 10/2004 | Laubach | ................. | B25C 1/005 227/109 |
| 7,516,876 B2 * | 4/2009 | Ohmori | ................... | B25C 1/047 227/10 |
| 7,628,304 B2 * | 12/2009 | Yamamoto | ............. | B25C 1/008 227/119 |
| 9,527,196 B2 * | 12/2016 | Segura | .................... | B25C 1/008 |

* cited by examiner

*Primary Examiner* — Michelle Lopez
(74) *Attorney, Agent, or Firm* — Thomas J. Nikolai; DeWitt LLP (57) ABSTRACT

A probe assembly of a nailer has a housing, a probe, and a spring. The housing is mounted around a nozzle of the nailer, and has a cavity and a supporting block protruding in the cavity near a bottom of the cavity. The probe is placed in the cavity, is held on the supporting block, and has a supporting cave recessed in the probe at a position corresponding to the supporting block and having an opening formed in a bottom of the probe. The spring is mounted in the cavity of the housing and disposed between the bottom of the cavity and the bottom of the probe. The probe of the probe assembly can be replaced easily without using any tool.

4 Claims, 9 Drawing Sheets

PROBE ASSEMBLY OF A METAL CONNECTOR NAILER

BACKGROUND OF THE INVENTION

1. Field of the Invention

The present invention relates to a metal connector nailer, and more particularly to a probe assembly of a metal connector nailer.

2. Description of Related Art

A conventional metal connector nailer has a probe mounted in a nozzle of the nailer for positioning assistance. When the nailer is in use, a tip of the probe is inserted into a hole of the metal connector to secure the position of the nailer. Then, a nail can be shot into the hole of the metal connector successfully.

Figure 9:
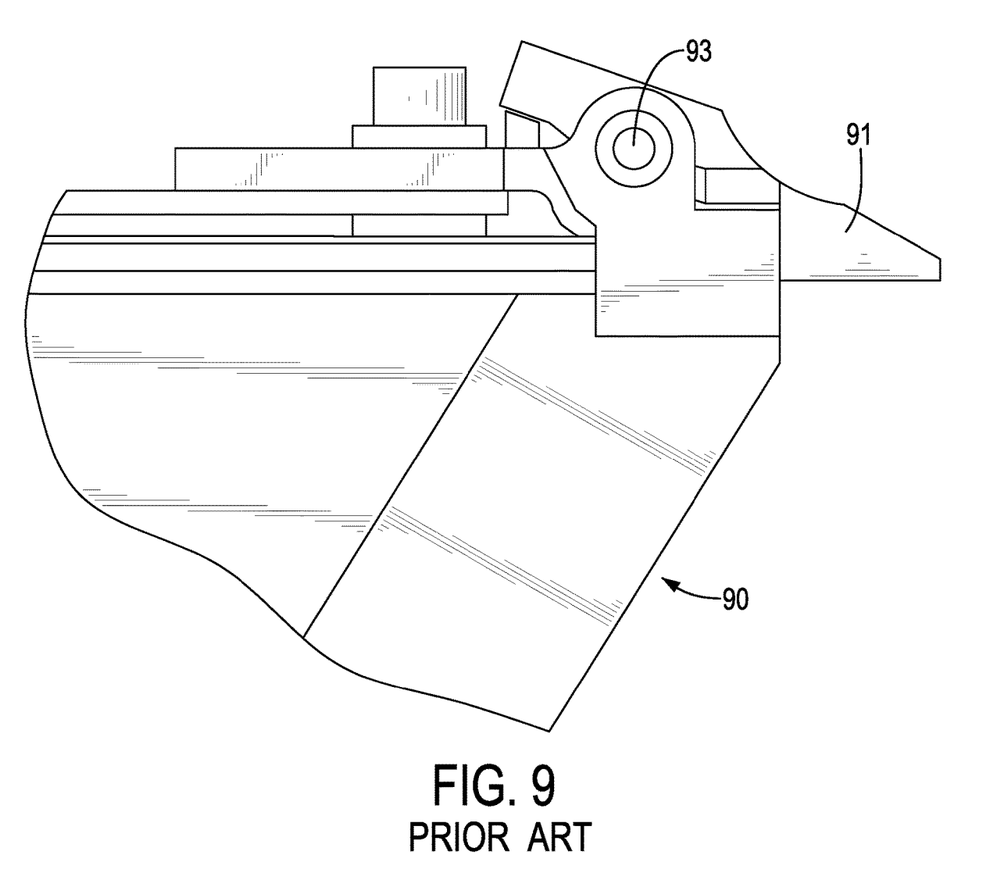
FIG. 9 is a side view of a probe of a conventional metal connector nailer.

With reference to FIG. 9, the probe 91 of the conventional metal connector nailer 90 is pivotally mounted in the nozzle of the nailer 90 with a bolt 93. The probe 91 will be pressed to pivot by mechanism of the nailer 90 while the nail is shooting, whereby the nail can pass through the initial position of the tip of the probe 91. However, the replacement of the probe 91 is complicated and time consuming Tools are required for unlocking the bolt 93, and only after that can the probe 91 be detached from the nailer 90.

To overcome the shortcomings, the present invention tends to provide a probe assembly of a metal connector nailer to mitigate or obviate the aforementioned problems.

SUMMARY OF THE INVENTION

The main objective of the invention is to provide a probe assembly of a metal connector nailer, wherein the probe can be replaced without using any tool.

The probe assembly has a housing, a probe, and a spring. The housing is longitudinally slidably mounted around a nozzle of a metal connector nailer and has a cavity and a supporting block. The cavity is formed in the housing and has two openings formed in longitudinal ends of the housing, a bottom, and two sides opposite to each other. The supporting block protrudes in the cavity of the housing, and is located near the bottom of the cavity. The probe is placed in the cavity of the housing, is held on the supporting block of the housing, and has a bottom, two sides opposite to each other, and a supporting cave. The supporting cave is recessed in the probe at a position corresponding to the supporting block of the housing, and has an opening formed in the bottom of the probe and a top abutting against a top of the supporting block of the housing. The spring is disposed between the bottom of the cavity of the housing and the bottom of the probe.

Other objects, advantages and novel features of the invention will become more apparent from the following detailed description when taken in conjunction with the accompanying drawings.

DETAILED DESCRIPTION OF PREFERRED EMBODIMENT

With reference to FIGS. 1 to 4, a probe assembly 20 in accordance with the present invention has a housing 21, a probe 23, and a spring 24.

The housing 21 is longitudinally and slidably mounted around a nozzle 11 of a metal connector nailer 10. In this embodiment, the housing 21 has a connecting plate 22 and a fastener 225. The connecting plate 22 is mounted on a side of the housing 21 and has a sliding slot 222. The sliding slot 222 is formed through the connecting plate 22 and extends longitudinally along the longitudinal direction of the housing 21. The connecting plate 22 is slidably connected to the nozzle 11 with a bolt 13 mounted through the sliding slot 222, such that the housing 21 can be longitudinally slid relative to the nozzle 11.

The housing 21 has a cavity 212 and a supporting block 213. The cavity 212 is formed in the housing 21 and has two openings formed respectively in longitudinal ends of the housing 21. The nozzle 11 is inserted in the cavity 212 and is disposed at the top of the cavity 212. Preferably, the housing 21 and the nozzle 11 each have a respective engaged portion 216, 111, and the two engaged portions 216, 111 are engaged with each other. The engaged portions 216, 111 of the housing 21 and the nozzle 11 extend longitudinally along the longitudinal direction of the housing 21, are respectively formed as a rib protruding from an inner surface of the cavity 212 and a recess, and are applied for fixing a position of the housing 21 relative to the nozzle 11.

The supporting block 213 protrudes from the inner surface of the cavity 212, and is located near the bottom of the cavity 212. The probe 23 is placed in the cavity 212 of the housing 21, is held on the supporting block 213, is disposed near the bottom of the cavity 212, and abuts against the nozzle 11 to be held in position by the nozzle 11. The probe 23 has a supporting cave 232. The supporting cave 232 is recessed in the probe 23 at a position corresponding to the supporting block 213, and has an opening formed in the bottom of the probe 23. The probe 23 can be hooked on the supporting block 213 via the opening of the supporting cave 232. The supporting cave 232 and the supporting block 213 are engaged with each other, and the top of the supporting cave 232 abuts the top of the supporting block 213. Preferably, the supporting block 213 of the housing 21 has two protrusions 2130 respectively protruding from opposite sides of the cavity 212, and corresponding to each other in shape and position. The supporting cave 232 of the probe 23 has two recesses 2320 respectively recessed in opposite sides of the probe 23 at positions corresponding to the protrusions 2130, and correspond to each other in shape and position. Each recess 2320 has an opening formed in the corresponding side of the probe 23. Thus, the probe 23 may be held on the supporting block 213 steadily. Moreover, the supporting block 213 serves as a fulcrum of the probe 23. The tops of the supporting block 213 and the supporting cave 232 are curved surfaces, such that the probe 23 can be rotated smoothly on the top of the supporting block 213.

The spring 24 is mounted in the cavity 212 of the housing 21 and is disposed between the bottom of the cavity 212 and the bottom of the probe 23. The spring 24 presses the probe 23 upward to abut against the nozzle 11, so the tip of the probe 23 is disposed at an initial position where the nail is to be pushed through. Preferably, the cavity 212 has a notch 215 recessed in the bottom thereof, and the probe 23 has a jut 233 protruding from the bottom thereof. The spring 24 is disposed between the notch 215 and the jut 233 to limit the position of the spring 24.

Figure 1:
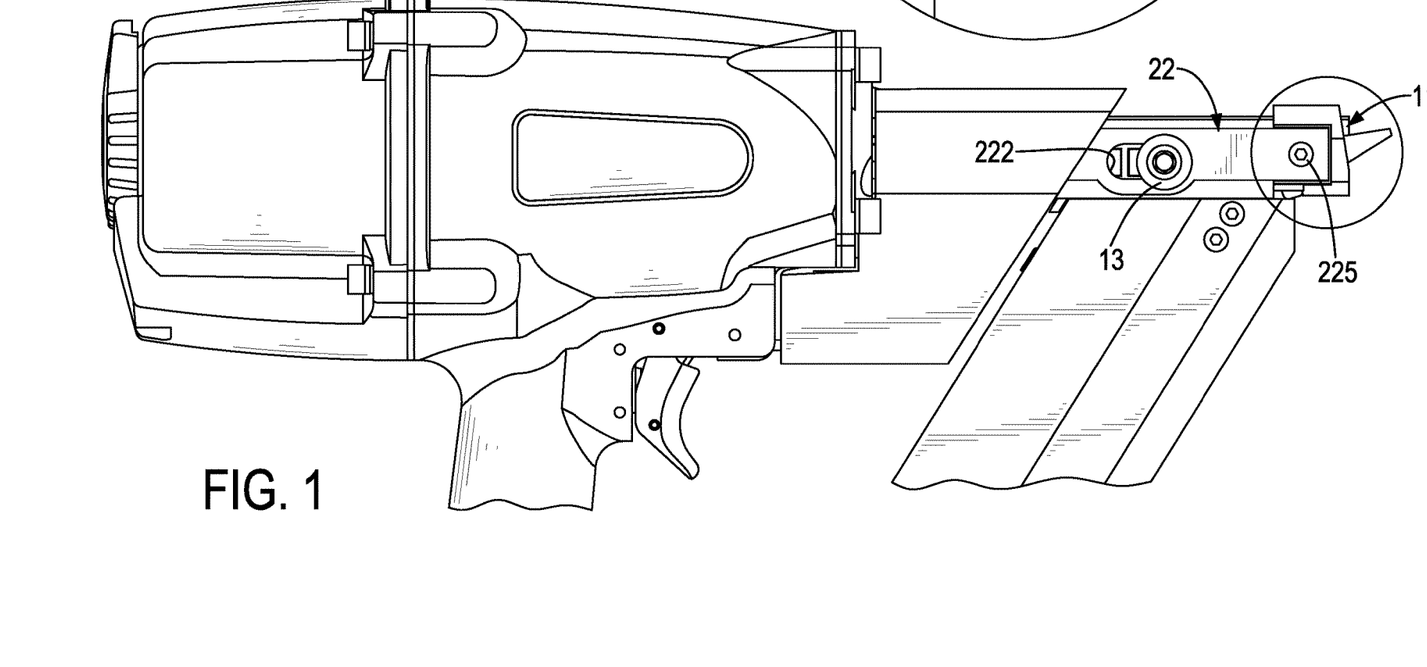
FIG. 1 is a side view of a metal connector nailer with a probe assembly in accordance with the present invention.
Figure 1A:
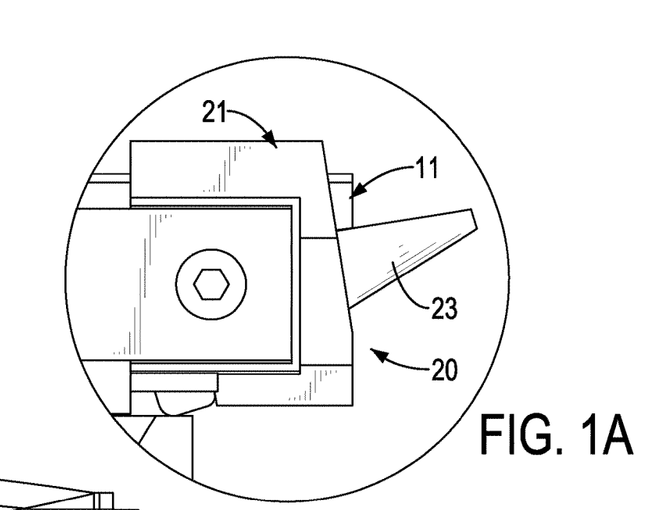
FIG. 1A is an enlarged side view of the probe assembly in FIG. 1.
Figure 2:
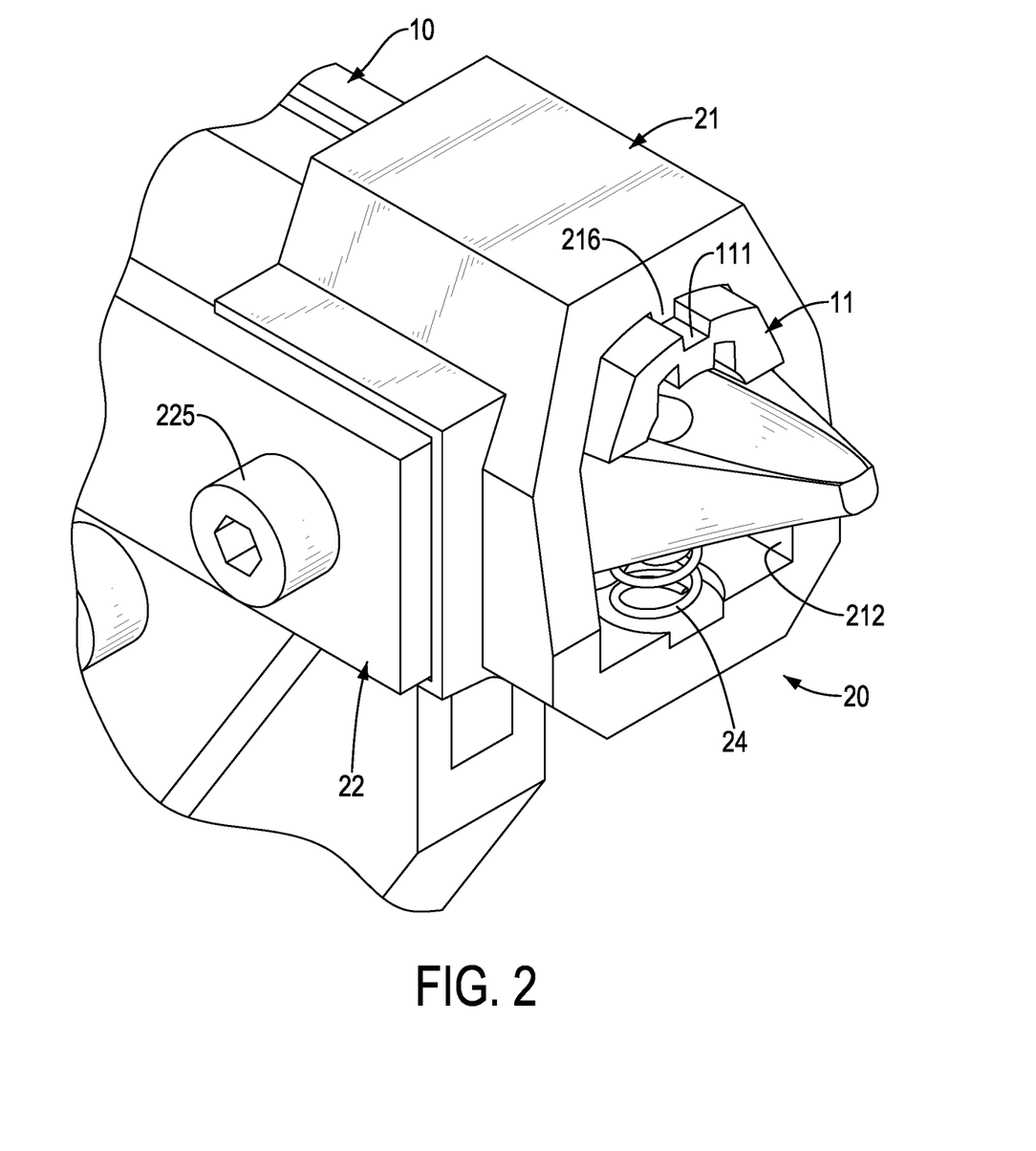
FIG. 2 is an enlarged perspective view of the probe assembly in FIG. 1.
Figure 3:
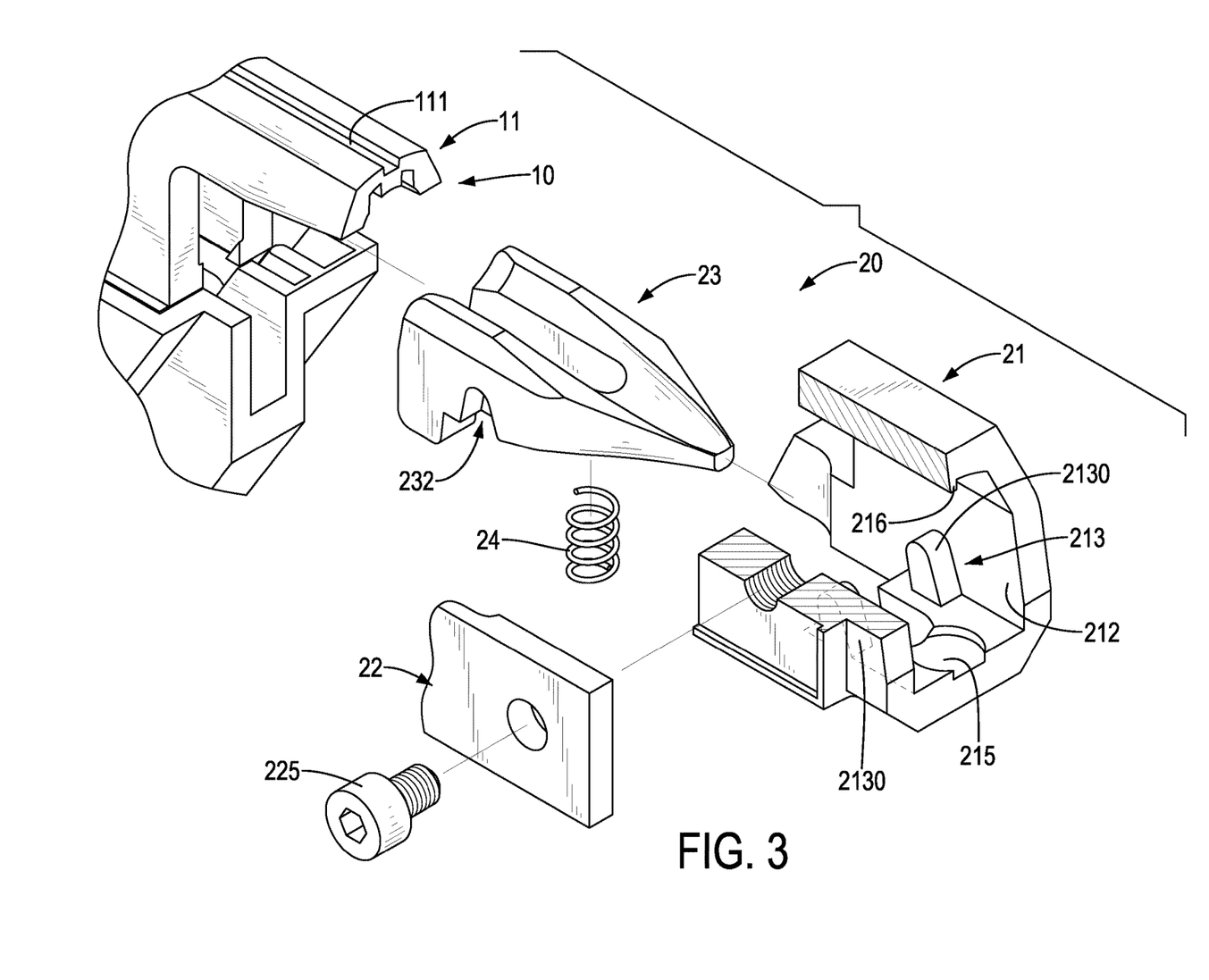
FIG. 3 is an enlarged exploded perspective view in partial section of the probe assembly in FIG. 1.
Figure 4:
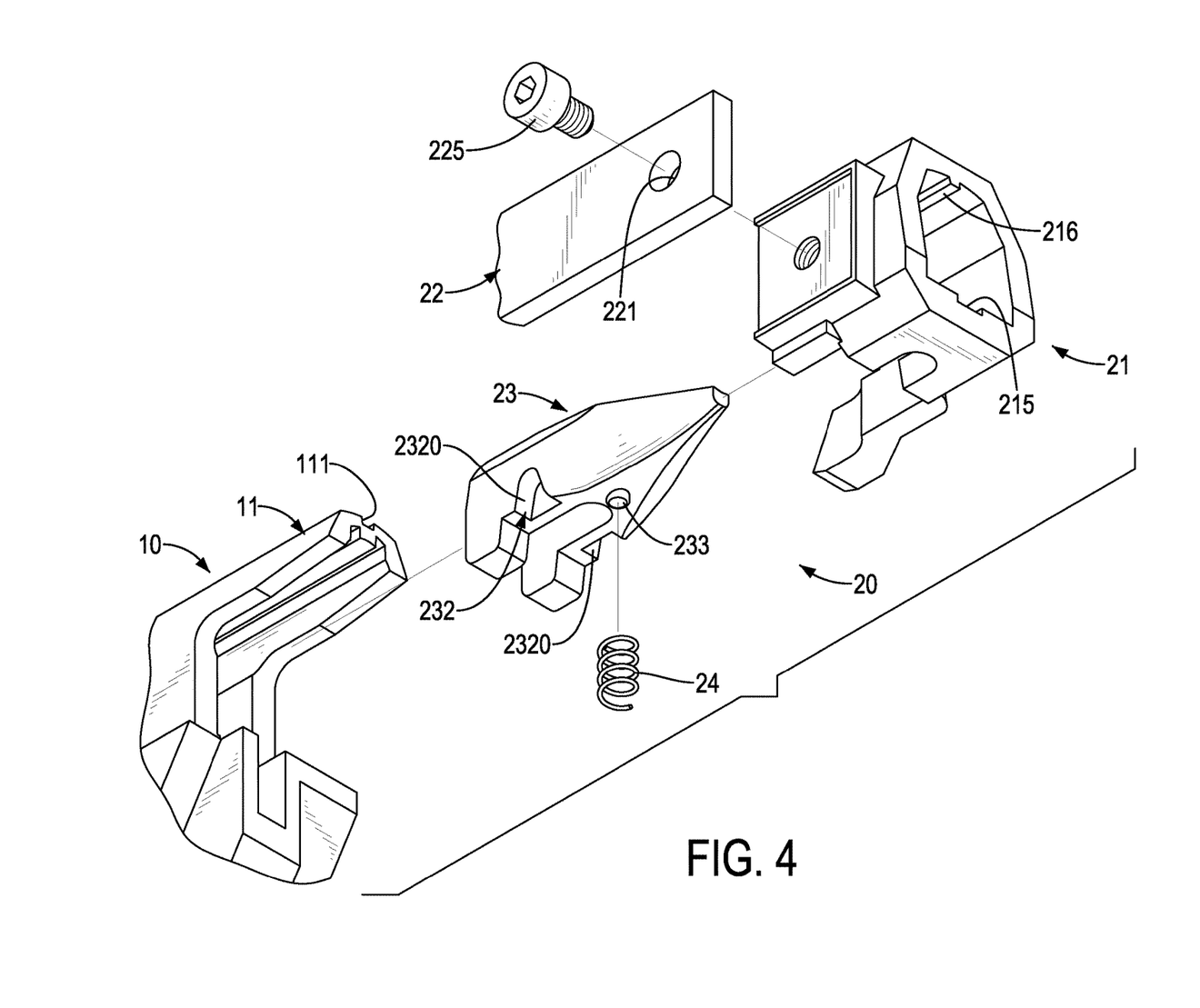
FIG. 4 is another enlarged exploded perspective view of the probe assembly in FIG. 1.
Figure 5:
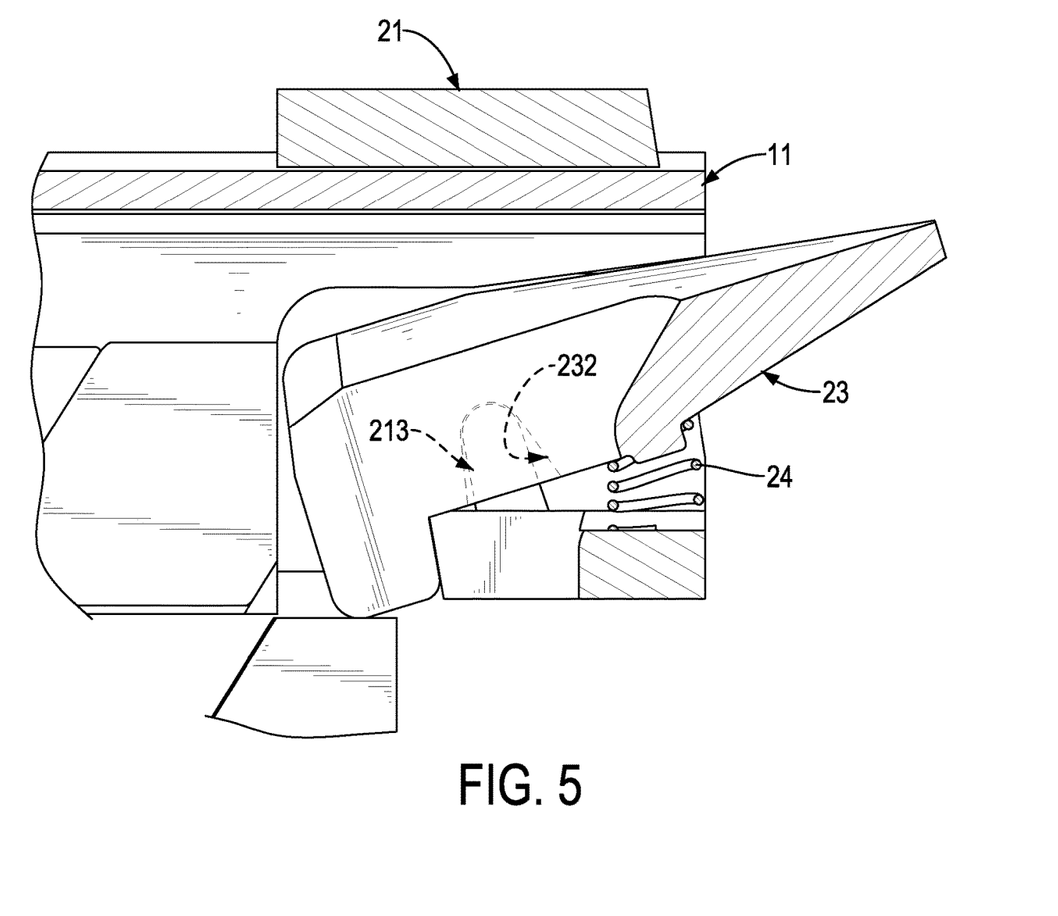
FIG. 5 is an enlarged cross sectional side view of the probe assembly of the metal connector in FIG. 1.
Figure 6:
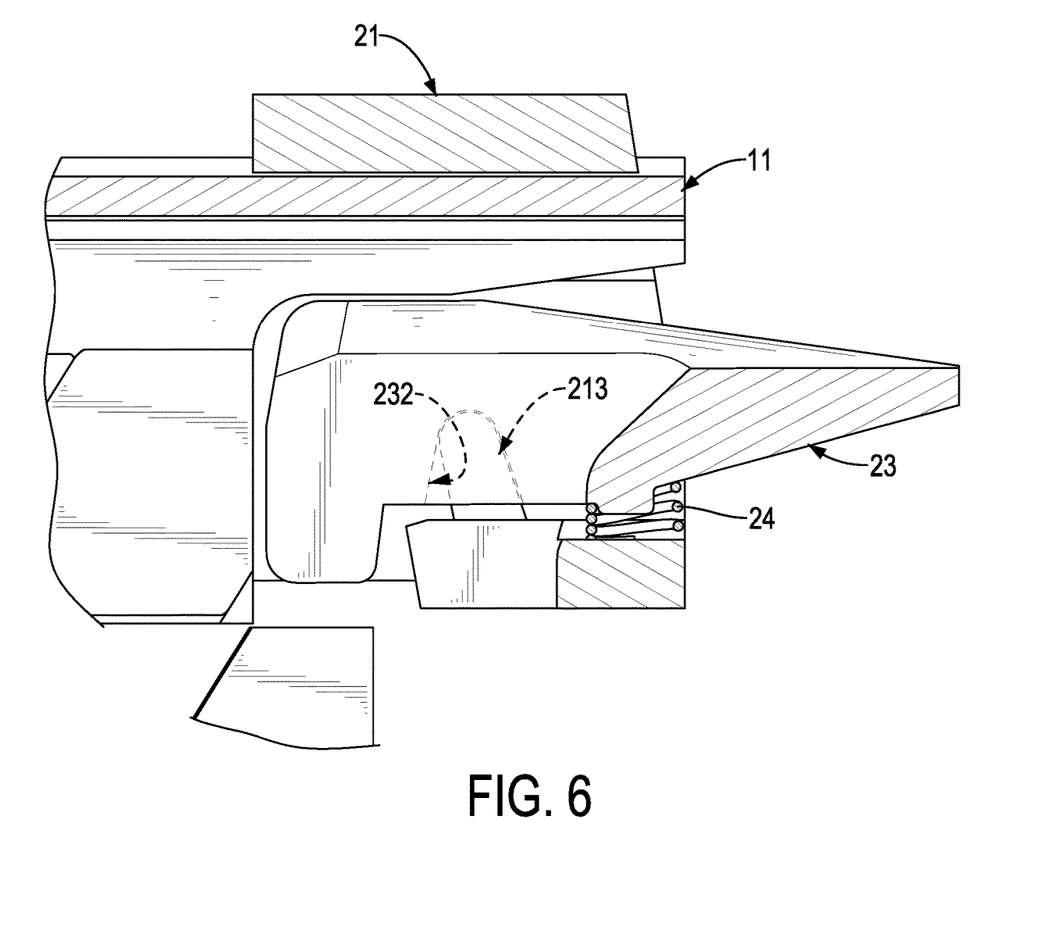
FIG. 6 is an enlarged operational cross sectional side view of the probe assembly in FIG. 1.
Figure 7:
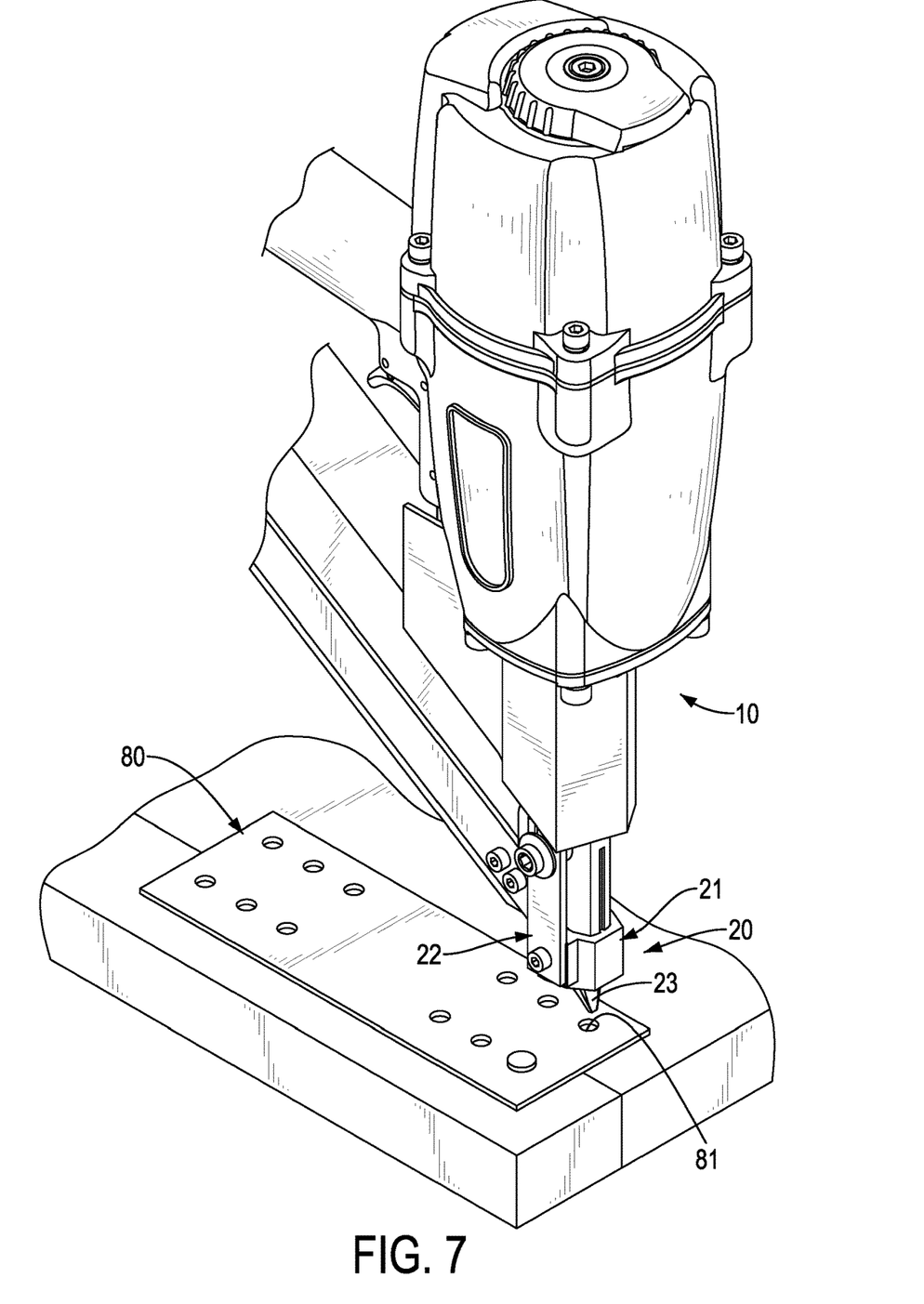
FIG. 7 is an operational perspective view of the metal connector nailer with the probe assembly in FIG. 1.
Figure 8:
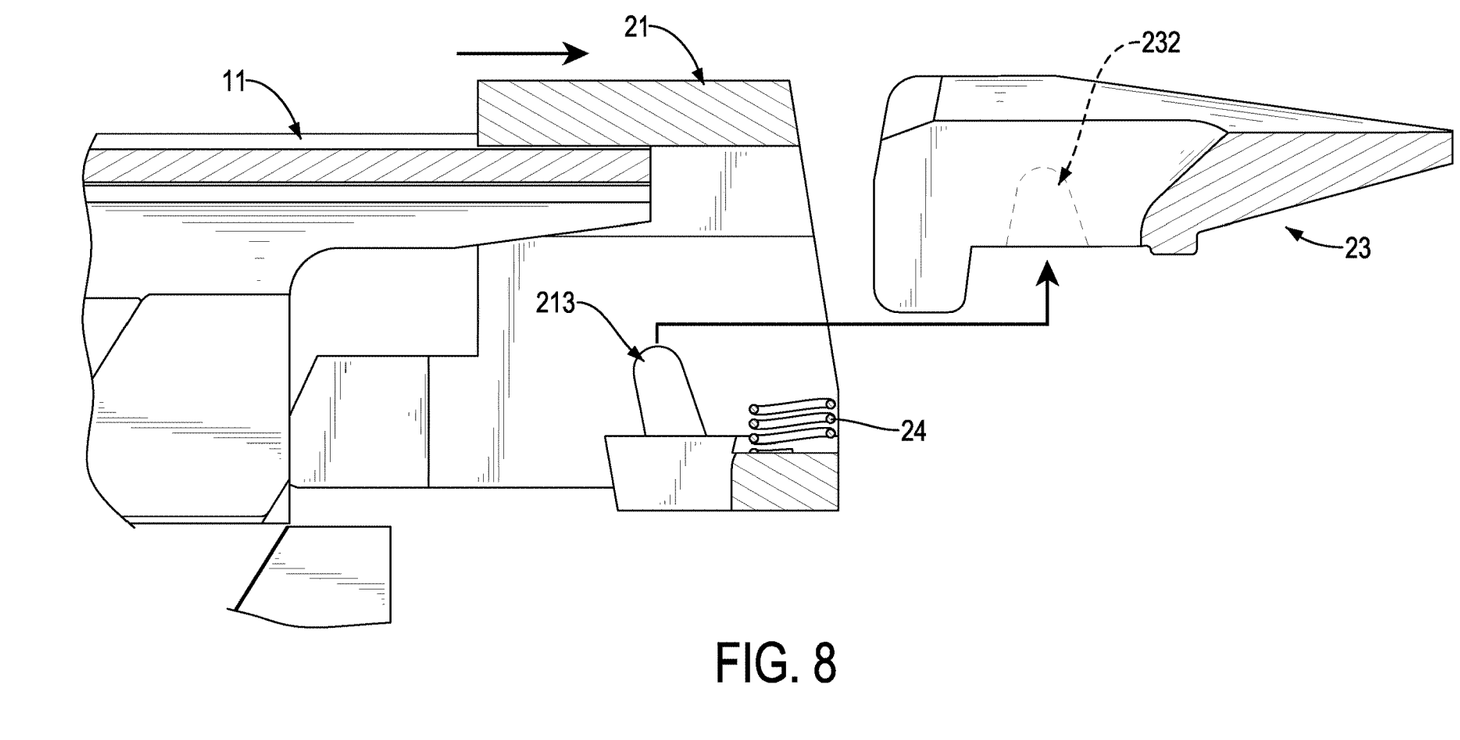
FIG. 8 is an enlarged operational cross sectional side view of the probe assembly in FIG. 1, showing disassembly of the probe.

With reference to FIGS. 5 to 7, when the nailer 10 with the probe assembly 20 in accordance with present invention is in use, the tip of the probe 23 is inserted into a hole 81 of the metal connector 80 to secure shooting position of the nailer 10. When a nail is being shot, the probe 23 will be driven by the shooting mechanism to rotate with the top of the supporting block 213 as the fulcrum, and the tip of the probe 23 will move downward away from the nozzle 11. After that, the nail can be shot into the hole 81 of the metal connector 80. With reference to FIG. 8, to replace the probe 23, the housing 21 is pulled forward to release the fixation between the probe 23 and the nozzle 11. Secondly, the probe 23 is moved upward to release the engagement between the supporting cave 232 of the probe 23 and the supporting block 213 of the housing 21, and the probe 23 can be taken out from the cavity 212. After that, a replacement probe 23 is inserted into the cavity 212, and the supporting cave 232 of the probe 23 is hooked on the supporting block 213 to hang the probe 23 on the supporting block 213. Then, the housing 21 is pushed backward to the initial position, and the probe 23 is secured by the nozzle 11. The replacement of the probe 23 of the probe assembly of the present invention requires no tools, and maintenance of the nailer 10 is easy and convenient.

What is claimed is:

1. A probe assembly comprising:
   a housing having
      a cavity formed in the housing and having two openings formed respectively in longitudinal ends of the housing, a bottom, and two sides opposite to each other; and
      a supporting block protruding in the cavity of the housing, and located near the bottom of the cavity; and
   a probe placed in the cavity of the housing, held on the supporting block of the housing, and having
      a bottom;
      two sides opposite to each other; and
      a supporting cave recessed in the probe at a position corresponding to the supporting block of the housing, the supporting cave having an opening formed in the bottom of the probe and a top abutting against a top of the supporting block of the housing; and
   a spring disposed between the bottom of the cavity of the housing and the bottom of the probe.

2. The probe assembly as claimed in claim 1, wherein
   the supporting block of the housing has two protrusions respectively protruding in the two sides of the cavity of the housing, and corresponding to each other in shape and position; and
   the supporting cave of the probe has two recesses respectively recessed in the two sides of the probe at positions corresponding to the protrusions of the supporting block of the housing, and corresponding to each other in shape and position.

3. The probe assembly as claimed in claim 2, wherein each recess of the supporting cave of the probe has an opening formed in a corresponding side of the probe.

4. The probe assembly as claimed in claim 3, wherein
   the housing has a notch recessed in the bottom of the cavity of the housing;
   the probe has a jut protruding from the bottom of the probe; and
   the spring is disposed between the notch of the housing and the jut of the probe.

* * * * *